OVERLOAD PROTECTION CIRCUIT FOR TRANSISTORS

Filed Nov. 6, 1967 2 Sheets-Sheet 1

INVENTOR
CONSTANTINE A. SPYROU
BY
Hopgood & Calimafde
ATTORNEYS

INVENTOR
CONSTANTINE A. SPYROU
BY
Hopgood & Calimafde
ATTORNEYS

United States Patent Office 3,544,845
Patented Dec. 1, 1970

3,544,845
OVERLOAD PROTECTION CIRCUIT FOR TRANSISTORS

Constantine A. Spyrou, Island Park, N.Y., assignor to Harman-Kardon Inc.

Filed Nov. 6, 1967, Ser. No. 680,925
Int. Cl. H02h 7/00
U.S. Cl. 317—33 6 Claims

ABSTRACT OF THE DISCLOSURE

A circuit for preventing failure and other damage to transistors used in amplifiers and other load supplying devices in which a sensing means continuously monitors for an overload condition of the amplifier and when such condition occurs, causes the circuit to effectively disconnect the input signal from the amplifier as long as the condition continues.

BACKGROUND OF THE INVENTION

As those knowledgeable in the art are aware, transistor amplifiers fail when overloaded by an excessive input signal, by a shorted or grossly mismatched load, or when an inductive load or resonating load appears across the output. In the past, a number of techniques have been used in attempting to eliminate these problems.

The first of these techniques involves designing the amplifier so that it can take a short term overload and using a protective fuse for long term overloads. However, this method is useful only for relatively low power. For power higher than approximately 30 watts, the industry cannot supply parts (transistors and heat sinks) that can withstand the overloads. Most manufactuers provide no protection at all for high powered amplifiers for any kind of overload.

In a second technique, developed by the present inventor, diodes are used to limit the current of the output transistors. However, this method does not offer positive protection so that when a long term overload occurs, failure of the transistors will still occur. It also has the further disadvantage that it provides no protection for inductive loads.

A third technique makes use of diodes to short out the driver amplifier when overloads occur on the main amplifier. This technique provides protection against shorted loads and excessive input signal to the main amplifier but no protection against an inductive load or a grossly mismatched load.

In a fourth technique, also developed by the present inventor, use is made of a transistor to short out the input signal into the driver and output stages. This method works only on alternate half-cycles and its usefulness is questionable for all types of overloads.

A fifth technique employs incandescent bulbs as emitter resistors to absorb any overload. This method provides very good long term overload protection for a shorted output or excessive input signal but provides no short term protection, nor does it provide protection against an inductive load. This technique also "robs" power from the amplifier and, under continuous power operation, the available amplifier power output drops off as the bulbs get hotter and their resistance increases. Thus it will be seen that despite numerous efforts by workers in the art, none of the prior devices provide a satisfactory solution to the problem of transistor failure from the different types of overload encountered.

OBJECTS OF THE INVENTION

It is a primary object of this invention to make available a protective circuit for transistors used in amplifiers and other load-supplying devices which will provide absolute protection against the different types of overload referred to above and which will aso provide protection against excessive heat sink temperatures.

All of the objects, features and advantages of this invention and the manner of attaining them will become more apparent and the invention itself will be best understood by reference to the following description of the invention taken in conjunction with the accompanying drawing.

BRIEF SUMMARY OF THE INVENTION

The overload protection circuit of this invention is connected between a low level amplifier and an output amplifier which receives its input signal from the low level amplifier. The circuit comprises three sections cooperatively associated with each other, viz. a switching section, a triggering section and a timing section. The switching section serves either as a through path or an open circuit for the signal applied to one side thereto from the low level amplifier and the output amplifier connected to the other side, depending upon whether the switch is "on" or "off." The sections are connected to operate in such a manner that when the output amplifier is subjected to an overload condition, the triggering section is caused to bias the switching section to cutoff, resulting in an open circuit condition between the low level amplifier and the output amplifier. This open circuit condition will remain for a predetermined period of time determined by the parameters of the timing circuit, after which the switching circuit will be either automatically closed to reconnect the load to the low level amplifier to the output amplifier or caused to maintain its open circuit condition, depending upon whether or not the overload has been removed.

DESCRIPTION OF THE PREFERRED EMBODIMENT

Figure 1:
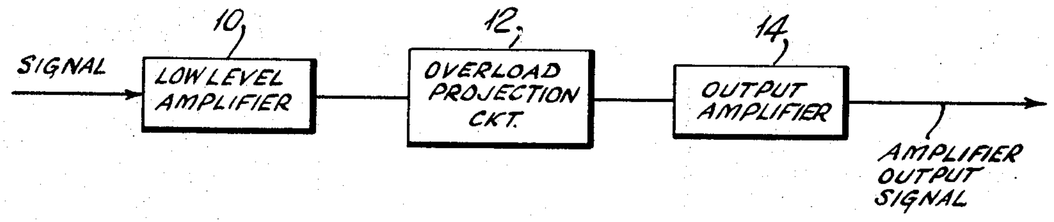
FIG. 1 is a block diagram of a portion of a typical system which embodies the overload protection circuit of this invention.

Referring now to the drawing, FIG. 1 shows a block diagram of one illustrative system which employs the overload protection circuit of this invention. This system comprises a preamplifier or low level amplifier 10 which receives a signal, amplifies the same and feeds it to a power output amplifier 14 through the overload protection circuit 12 of this invention. It is to be understood that while the system shown in FIG. 1 is used in the description of this invention, the overload protection circuit 12 may also be placed between an output amplifier and a speaker load connected thereto, or between transistorized circuits of a variety of types which are not amplifiers.

Figure 2:
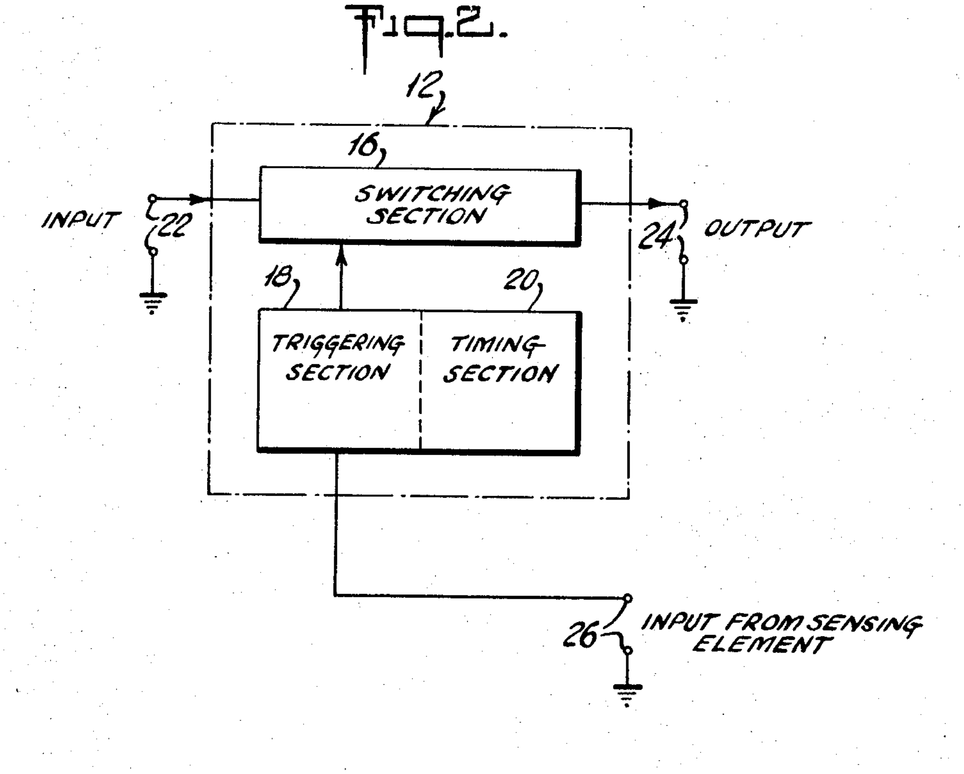
FIG. 2 is a functional block diagram which illustrates the functions of different sections of the overload protection circuit.

In FIG. 2 there is shown a functional block diagram of the overload protection circuit 12 seen in FIG. 1. It will be seen from FIG. 2 that the overload protection circuit 12 comprises three sections, viz., a switching section 16, a triggering section 18, and a timing section 20. From this figure it will be seen that an input signal is applied to a pair of input terminals 22 and passes through the switching section 16 to a pair of output terminals 24. The triggering section 18 controls the "on" or "off" condition of the switching section 16 in accordance with an input signal from a sensing element which is applied to a pair of terminals 26 connected to the input of the triggering section 18. The timing section 20 is intimately assocated with the triggering section 18 and is employed in a manner to cause the triggering section 18 to either close the switching section 16 after it has been opened, or maintain it in its open condition, depending upon the absence or presence respectively of a signal at the input terminals 26 indicative of an overload condition on the output amplifier 14. This will be more fully understood as the description progresses.

Figure 3:
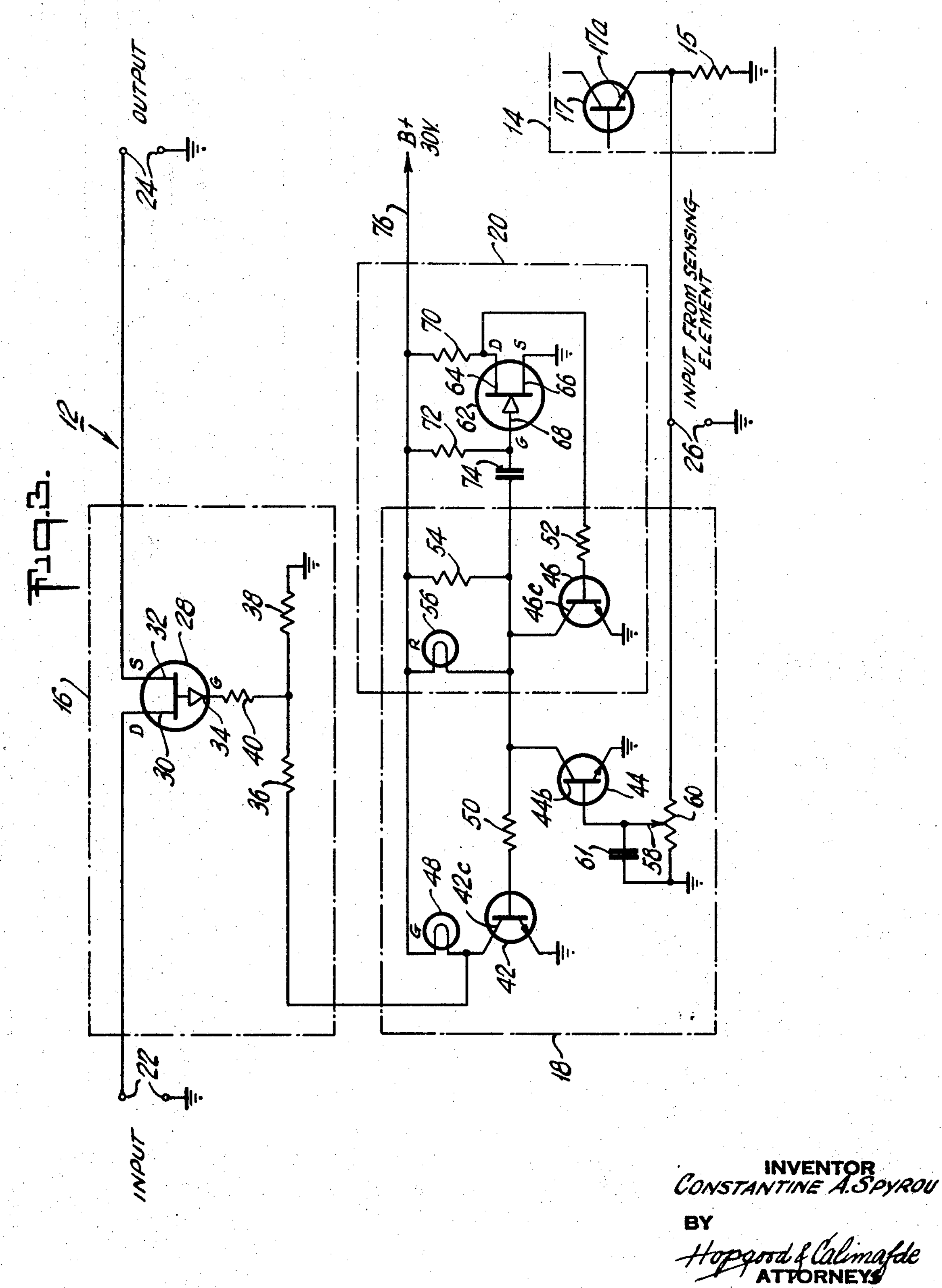
FIG. 3 is a schematic wiring diagram of one form of the overload protection circuit in accordance with the principles of this invention.

Reference is now made to FIG. 3 which shows a schematic wiring diagram of one form of the circuit of this invention. The switching section 16 includes a P-channel junction field effect transistor 28 having drain, source and gate electrodes 30, 32 and 34 respectively. This transistor is operated in the ohmic region of its characteristic curve by a biasing network comprising the resistors 36, 38 and 40. This makes the transistor 28 a voltage controlled switching resistor which can switch an AC signal without changing its reference level and without the introduction of any transients, noise or distortion.

The triggering section 18 consists of a modified Schmidt triggering circuit and includes the NPN transistors 42, 44 and 46 with a green incandescent bulb 48, base resistors 50 and 52 and a collector load resistor 54 in parallel with a red incandescent bulb 56. The base **44*b* of the transistor 44 is connected to the slider arm 58 of a potentiometer 60, which is used to set the level at which the triggering circuit 18 will be actuated by the potential at the terminals 26. A suitable capacitor 61 is connected between the slider arm 58 and one end of the potentiometer 60. The other end of the potentiometer 60 is connected to receive an input voltage from the terminals 26 for actuating the triggering circuit 18 when the output amplifier 14 of FIG. 1 is subjected to an overload condition. This input voltage may be obtained from any suitable sensing element in the amplifier 14, such as, for example, a resistor 15 connected in series with the emitter electrode 17*a* of an output transistor 17 in the amplifier 14**.

The timing section 20 comprises a one shot multi-vibrafor and includes an N-channel field effect transistor 62 having drain, source and gate electrodes 64, 66 and 68 respectively, with a resistor 70, another resistor 72 and a capacitor 74. The timing section 20 also includes the portion of the triggering section 18 which is included in the dashed line rectangular 18 of FIG. 3, viz, the transistor 46, resistors 52 and 54 and the bulb 56. The time period of the circuit of the timing section 20 may be any suitable period, such as 15 seconds, as will be more fully appreciated as the description proceeds. The timing section 20 is triggered by a negative pulse from the transistor 44 that is applied to the collector **46*c* of the transistor 46, as will later appear. The operating potential for the entire circuit of FIG. 3 is obtained from a suitable source of B+ supply connected between the wire 76** and chassis ground.

Referring again to FIGS. 1 and 2, the overload protection circuit 12 operates in such a manner that when the output amplifier 14 is subjected to an overload condition, this circuit senses such overload and switches off the input signal into the amplifier 14., i.e., the circuit 12 functions as an open switch so that the signal from the low level amplifier 10 at the input terminals 22 does not appear at the output terminals 24 of the circuit 12. The circuit 12 remains in this state for approximately 15 seconds and then it samples again. If the overload has been removed, it switches back to normal. However, if the overload has not been removed, it resets itself for another period of approximately 15 seconds. If the overload is not removed, it will continue sampling and resetting for an indefinite period of time without any damage occurring to the transistors in the amplifier 14, or to any of the other components.

The state of the circuit 12 is indicated by the two incandescent bulbs 48 and 56 of FIG. 3, the green bulb 48 indicating the operating state and the red bulb 56 indicating the protected state resulting from overload.

A more detailed explanation of the operation of the overload protection circuit 12 will now be described with particular reference to FIG. 3. When the amplifier 14 to which the overload protection circuit 12 is connected is not in an overload state, the transistor 62 conducts heavily enough so that there is insufficient bias to turn on the base of the transistor 46 through the resistor 52. The capacitor 74 is charged to the 30 volt potential on the wire 76 through the path comprising the cold resistance of the red bulb 56 in parallel with the resistor 54, the capacitor 74, and the gate to source junction 68–66 of the transistor 62, which is biased on by the resistor 72. The collector **46*c* of the transistor 46 has a potential equal to the 30 volt value, which provides enough bias through the resistor 50 to turn on the transistor 42 and light up the green bulb 48. The transistor 44 is off because the potential at the terminals 26 is below a predetermined threshold value so that any bias on the base 44*b* is insufficient to render this transistor conductive. The transistor 28 is on because there is no bias on its gate 34 since all the voltage is across the green bulb 48 through conduction of the transistor 42. With the transistor 28 on, its resistance is at its minimum value and this allows the signal to pass from the input terminals 22 to the output terminals 24 where the input of the amplifier 14** is connected.

When an overload condition is imposed on the amplifier 14, the potential across the sensing element 15 changes, causing the potential at the terminals 26 and on the base **44*b* to exceed the threshold potential value. This turns on the transistor 44, causing the circuit to go into the protective state in the following manner. The transistor 42 comes on and provides a discharge path for the capacitor 74 through the transistor 44 and the resistor 72. The voltage across the capacitor 74 puts the transistor 62 into a cutoff condition with the result that its drain voltage is caused to rise to the 30 volt value. This now provides enough bias to the transistor 46 through the resistor 52 to cause this transistor to go into conduction. This provides a different discharge path for the capacitor 74 through the resistor 72 and the transistor 46. With the transistor 46 now in conduction, the red bulb 56 comes on and the voltage on the collector 46*c* drops below the value which can provide enough bias to maintain the transistor 42 conductive. With the transistor 42 now non-conductive, the green bulb 48 goes off and the voltage on the collector 42*c* rises to the 30 volt value, thus providing enough bias to cutoff the transistor 28. When this transistor is cutoff, its resistance rises to a near infinite value and the signal cannot then pass from the input terminals 22 to the output terminals 24, so that the danger of damage to the transistors in the amplifier 14** is thus eliminated.

The overload protection circuit will now remain in this protective condition for approximately 15 seconds, which is the time it takes for the capacitor 74 to discharge. When this capacitor 74 is discharged, the circuit will again return to the operating condition, and the capacitor 74 will recharge through the gate to source junction 68–66 of the transistor 62 and the resistor 54 in parallel with the cold resistance of the red bulb 56. It takes approximately 2 microseconds for the capacitor 74 to recharge.

If the overload on the amplifier 14 has been removed, it will go into operation again but if it has not been removed, another pulse will turn on the transistor 44 and restart the entire cycle described above.

For the exemplary circuit shown in FIG. 3 and using a 30 volt supply potential, the following components provide very satisfactory operation:

Transistor 42—Fairchild 2N3642
Transistor 44—Fairchild 2N3642
Transistor 46—Fairchild 2N3642
Transistor 28—Amelco P1053 FET
Transistor 62—Amelco U1553 FET
Resistor 36—150K ohms
Resistor 38—100K ohms
Resistor 40—1K ohms
Resistor 50—47K ohms
Resistor 52—47K ohms
Resistor 54—3.3K ohms
Resistor 70—3.3K ohms
Resistor 72—10 megohms
Potentiometer 60—100 ohms
Capacitor 62—0.002 mmf.
Capacitor 74—1.0 mf.
Bulb 48—GE 327
Bulb 56—GE 327

With different transistors or supply voltage, the resistor-capacitor values in the timing section 20 would generally require modification.

It will be appreciated from the foregoing that the overload protection circuit of this invention provides a number of important advantages, among which are:

(1) *Absolute protection.*—When the protective circuit is employed and the triggering section threshold level is properly adjusted, there are no output amplifier device failures under any condition.

(2) *Fast action.*—The protective circuit acts in less than 5 microseconds maximum. The speed with which the circuit acts and the "time off" it gives to the transistors in the amplifier 14 places their safe operating curve to a non-repetitive 5 microsecond pulse, which is extremely important for inductive or resonating loads.

(3) *Automatic reset.*—The circuit, after 15 seconds, will automatically sample and if the overload has been removed, it will reinstate the amplifier 14 in operation; however, if the overland is not removed, the circuit will reset itself in the protective mode for another 15 seconds.

(4) *FET employed for timing and switching.*—Field Effect Transistors are employed in the timing and switching portions of the circuit. This enables switching of the signal without level change. It also provides greater reliability and a higher input impedance. This latter advantage affords greater simplicity in the timing circuit design.

(5) *No switching transients.*—The use of a unipolar field effect transistor for the transistor 28 introduces no transients due to switching because the switching is done only on an "AC" basis.

(6) *No distortion; no loss; no hum; no noise.*—The circuit introduces none of the above unwanted factors. The maximum loss in signal is 1 db maximum—the maximum loss in power is 0 db.

(7) *Reliable operation.*—The use of the bipolar transistors 42, 44 and 46 guarantees reliability in the triggering section 18 and the use of unipolar field effect transistors guarantees reliability in the timing and switching sections 20 and 16, respectively.

(8) *Green and red indicators.*—These show the state in which the amplifier 14 is placed by the protective circuit 12. The green light shows it safely operating and the red light safely protected against any overload.

(9) *Versatility.*—The protective circuit 12 can be employed to protect a variety of other load devices in lieu of the output amplifier 14.

While the foregoing description sets forth the principles of the invention in connection with specific apparatus, it is to be understood that the description is made only by way of example and not as a limitation of the scope of the invention as set forth in the objects thereof and in the accompanying claims.

What is claimed is:

1. An overload protection circuit for a load device, said circuit comprising first switching means having an input and an output adapted to be operatively connected to said load device and effective when conductive to operatively transfer a signal at said input to said output and when non-conductive to substantially completely prevent the transfer of a signal from said input to said output, control means responsive to an overload condition at said load device and actuated thereby to render said switching means non-conductive, and samplinge means including timing means operatively connected to said control means, normally in a first state in the absence of an overload condition, and second switching means effective after the sensing by said control means of an overload condition to place said timing means in a second state for a first predetermined time after said control means is actuated, and to thereafter return said timing means to its said first state for a second predetermined time shorter in duration than said first predetermined time, thereby to render said first switching means non-conductive and conductive during said first and second predetermined times respectively.

2. The invention described in claim 1 wherein said timing means is effective if said overload condition is still present after said second predetermined time to reactuate said deactuated control means and return said first switching means to a non-conductive state.

3. The invention described in claim 1 in which said control means comprises first visual means of a first color actuated when said control means is actuated for indicating the overload condition of said load device, and second means of a second color clearly distinguishable from said first color actuated when said control means is deactuated for indicating the normal-load condition of said load device.

4. The invention described in claim 1 wherein said switching and timing sections include field effect transistors.

5. The invention described in claim 1 wherein said triggering section comprises a Schmitt-type circuit.

6. The invention described in claim 1 wherein said control means and said timing means each comprise at least two semiconductor devices, one semiconductor device being common to said control means and said timing means.

References Cited

UNITED STATES PATENTS 3,122,697 2/1964 Kauders ------------ 317—22
3,303,388 4/1967 Means -------------- 317—33

J D MILLER, Primary Examiner
H. FENDELMAN, Assistant Examiner

U.S. Cl. X.R.

317—22; 330—51